(12) United States Patent
Gocksch

(10) Patent No.: US 6,350,558 B1
(45) Date of Patent: Feb. 26, 2002

(54) METHOD OF MAKING DECORATIVE PANELS

(76) Inventor: Rainer Gocksch, 903 St. Andrews Rd., Hollywood, FL (US) 33021

( * ) Notice: Subject to any disclaimer, the term of this patent is extended or adjusted under 35 U.S.C. 154(b) by 0 days.

(21) Appl. No.: 09/491,014

(22) Filed: Jan. 25, 2000

Related U.S. Application Data

(60) Provisional application No. 60/157,819, filed on Oct. 5, 1999.

(51) Int. Cl.$^7$ .................................................. G03F 7/00
(52) U.S. Cl. ........................ 430/320; 430/292; 264/220; 264/227
(58) Field of Search ................................ 430/320, 292, 430/321; 364/220, 227

(56) References Cited

U.S. PATENT DOCUMENTS

| | | | |
|---|---|---|---|
| 2,065,406 A | | 12/1936 | Silverman |
| 4,226,933 A | * | 10/1980 | Ishizawa et al. ............. 430/320 |
| 4,264,714 A | | 4/1981 | Trausch ....................... 430/320 |
| 4,455,320 A | | 6/1984 | Syrmis ........................ 426/383 |
| 4,652,513 A | | 3/1987 | Pentak et al. ............... 430/258 |
| 4,702,786 A | | 10/1987 | Tallman ....................... 156/154 |
| 4,727,013 A | | 2/1988 | Pentak et al. ............... 430/320 |
| 5,554,331 A | * | 9/1996 | Kildune ....................... 264/161 |

FOREIGN PATENT DOCUMENTS

| JP | 4-370788 A | * | 12/1992 |
|---|---|---|---|
| JP | 8-066961 A | * | 3/1996 |

* cited by examiner

Primary Examiner—John A. McPherson
(74) Attorney, Agent, or Firm—Robert C. Kain, Jr.; Fleit, Kain

(57) ABSTRACT

The method of making a dry film decorative panel covered with paint or covered with metal or plastic sheet film designed to look like metal includes providing a substrate, at least one sheet of dry photoresist film, developer wash for the dry film and at least one art work stencil. Preferably, any line art work can be utilized as the art work stencil. The dry film is placed intermediate the art work and on the substrate thereby forming a layered composite. The layered composite is exposed to UV light to polymerize the exposed areas. The art work is thereafter removed. Non-UV exposed dry film layer portions are washed away utilizing developer wash. The resulting UV exposed and polymerized dry film portions create relies on the substrate. Multiple layer relies are created by repeating the aforementioned steps. The relief and supporting substrate is painted to form a decorative panel or is covered with metal or metal-like plastic sheet foil. In another embodiment, the method of repetitively reproducing decorative panels from resinous or cast able material utilizes a press plate cast from the dry film decorative panel. Rather than painting or covering the relief, the relief and supporting substrate are used to create an inter negative using suitable molding compounds, such as resin, plastic, silicone rubber, plaster, etc. A positive press plate is then created from the inter negative. The positive press plate bears substantially the same decorative design as the dry film decorative panel. By repetitively pressing the resulting press plate into the resinous or cast able material and other substrates such as paper or other formidable substrates which harden when removed form the mold, multiple decorative panels are created having substantially the same decorative design as the dry film decorative panel.

19 Claims, 5 Drawing Sheets

METHOD OF MAKING DECORATIVE PANELS

This is a regular patent application based upon provisional patent application Ser. No. 60/157,819 filed Oct. 5, 1999, now pending.

The present invention relates to dry film decorative panels, which are either painted or covered with metal or metal appearance film, and decorative panels which are utilized as press plates to create a plurality of further decorative panels having substantially similar decorative design thereon.

BACKGROUND OF THE INVENTION

U.S. Pat. No. 4,727,013 to Pentak et al. discloses the use of creating decorative designs using dry film photoresist. Pentak also discloses abrading or "roughing up" the surface by acid etching or sand blasting and discloses the use of multiple layers of dry film. The dry film photoresist is exposed to a low level UV light to create a top polymerized crust which protects the unpolymerized thickness of film layer from being washed off by development solution. The film is only partially cured. U.S. Pat. No. 4,652,513 to Pentak et al. is identical to U.S. Pat. No. 4,727,013.

U.S. Pat. No. 4,702,786 to Tallman discloses the use of photoresist for decorative panels.

U.S. Pat. No. 4,455,320 to Syrmis discloses the use of photoresist design press plate for making chocolate candy with relief surface features.

U.S. Pat. No. 2,065,406 to Silverman discloses a foil cover placed over smooth and rough surfaces and the use of photoresist for decorative designs.

U.S. Pat. No. 4,264,714 to Trausch discloses the use of photoresist.

OBJECTS OF THE INVENTION

It is an object of the present invention to provide a dry film decorative panels which are easy to manufacture, enable the designer-manufacturer to create multiple designs utilizing multiple layers of dry film and produce a relief or a plurality of reliefs on a substrate which can either be painted or covered with metal foil or plastic sheet foil having a metal look.

It is an additional object to create reliefs of multiple heights on a substrate.

It is another object of the present invention to provide a quick and easy method to produce a press plate made of a dry film decorative panel enabling a manufacturer to quickly produce the design, reproduce the design in a castable material or compound to form a substantially harder press plate and produce multiple panels having substantially the same decorative design as the original dry film decorative panel. In this manner, press plates are created for short production runs where traditional stainless steel plates which are far too expensive to use in such short manufacturing cycles.

SUMMARY OF THE INVENTION

The method of making a dry film decorative panel covered with paint or covered with metal or plastic sheet film designed to look like metal includes providing a substrate, at least one sheet of dry photoresist film, developer wash for the dry film and at least one art work stencil. Preferably, any line art work can be utilized as the art work stencil. The dry film is placed intermediate the art work and on the substrate thereby forming a layered composite. The layered composite is exposed to UV light for a predetermined period of time to polymerize the exposed areas. The art work is thereafter removed from the layered composite. Non-UV exposed dry film layer portions are washed away utilizing developer wash. The resulting UV exposed and polymerized dry film portions create reliefs on the substrate. Multiple layer reliefs are created by repeating the aforementioned steps. The relief and supporting substrate is painted to form a decorative panel or is covered with metal or metal-like plastic sheet foil. The foil is adhered to the relief supporting substrate to form the decorative panel. In another embodiment, the method of repetitively reproducing decorative panels from resinous material utilizes a press plate cast from the dry film decorative panel. Rather than painting the relief and supporting substrate or covering the relief and supporting substrate with foil, the relief and supporting substrate are used to create an internegative using resinous or castable compound material. From the substrate bearing the relief, a mold is created using suitable molding compounds, such as resin, plastic, silicone rubber, plaster, etc. This mold serves as an internegative. A positive press plate is then created from the internegative. The positive press plate bears substantially the same decorative design as the dry film decorative panel. By repetitively pressing the press plate into the resinous material and other substrates such as paper or other formable substrates or other castable compounds which harden when removed form the mold, multiple decorative panels are created having substantially the same decorative design as the dry film decorative panel.

BRIEF DESCRIPTION OF THE DRAWINGS

Further objects and advantages of the present invention can be found in the detailed description of the preferred embodiments when taken in conjunction with the accompanying drawings in which.

DETAILED DESCRIPTION OF THE PREFERRED EMBODIMENTS

The present invention relates to a method of making a dry film decorative panel covered with paint or covered with metal foil or plastic sheet having the appearance of metal foil and creating a press plate from a dry film decorative panel which, in turn, is utilized to create multiple decorative panels from resinous material.

Figure 1A:
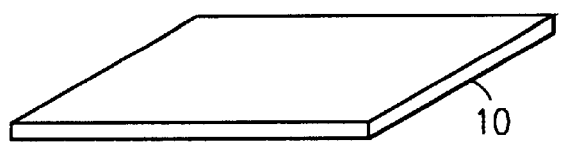
FIGS. 1A–1F diagrammatically illustrate the steps to create a raw dry film decorative panel.

FIGS. 1A–1F diagrammatically illustrate a method of making a raw dry film decorative panel. FIG. 1A shows substrate 10 which is utilized to support dry film 12 shown in FIG. 1B. The following table sets forth some characteristics and examples of substrate.

Exemplary Substrate Table
- metal
- phenolic
- hardboard (wood composite)
- plastic (substantially rigid) sheets
- plastic composites
- wood (plywood)
- sheet metal
- metal composites
- metal laminates
- maximum size 48"×120"

Figure 1B:
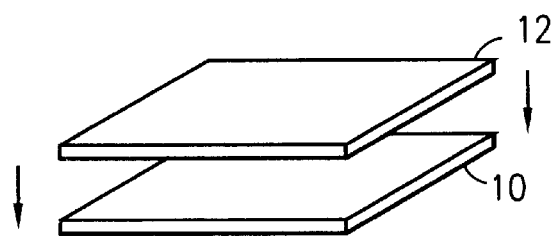

Dry film 12 in FIG. 1B is a dry photoresist film typically utilized in the manufacture of printed circuit boards. One example of dry film is RISTON manufactured by Dupont. The Dupont dry film is a photo polymer dry film. Persons of ordinary skill in the art, upon reading the specifications and the directions of dry film, can easily attach dry film 12 to substrate 10.

Figure 1C:
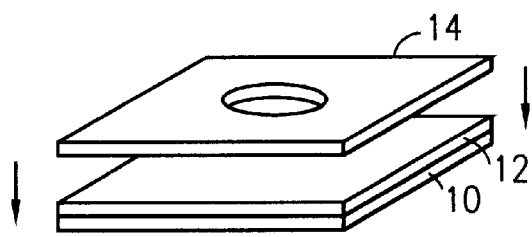

In FIG. 1C, an art work stencil 14 is placed on top of dry film layer 12. This results in dry film layer 12 being intermediate substrate 10 and art work 14. Art work 14 can be any type of line art work or stencil.

Figure 1D:
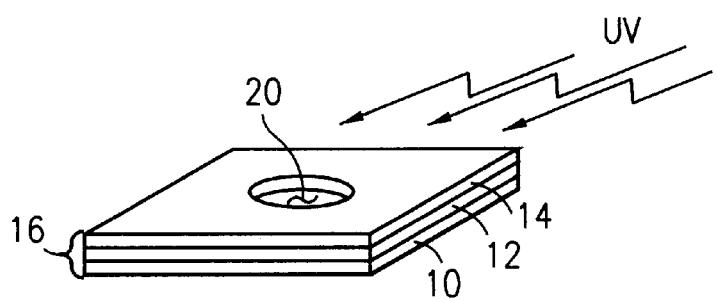

FIG. 1D shows UV light directed towards the layered composite structure 16 which includes substrate 10, dry film 12 and art work stencil 14. Typically, layered composite 16 is exposed to UV light approximately 5–25 seconds.

Figure 1E:
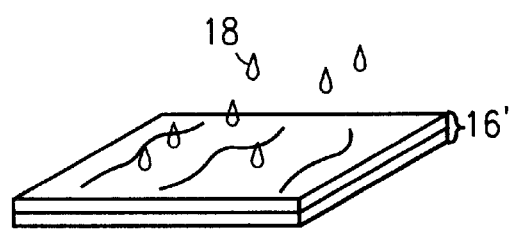

FIG. 1E shows that after removal of art work stencil 14 from layered composite. Developer wash 18 is utilized to wash away non-UV exposed dry film layer portions after the film cures. Cured areas are polymerized. The non-UV exposed dry film layer portions are those portions beyond art work stencil cutout 20 shown in FIG. 1D. The dry film exposed to UV light due to cutout 20 is cured by the UV light.

Figure 1F:
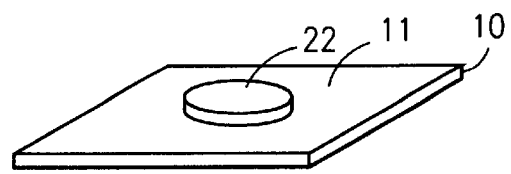

After the developer wash, FIG. 1F shows that substrate 10 has a relief 22 created thereon. The edges of relief 22 are quite uniform and "clean." In this sense, the edges of the dry film define an approximately 90 degree angle in relation to surface 11 of substrate 10. Further, relief 22 has a uniform thickness throughout its two dimensional area.

Figure 2:
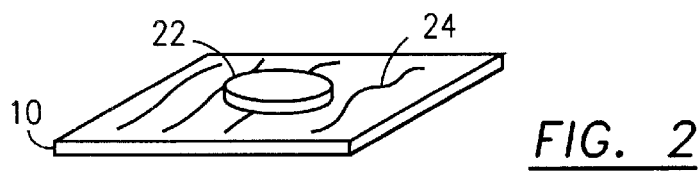
FIG. 2 diagrammatically illustrates a painted dry film decorative panel.

FIG. 2 shows that the relief 22 and supporting substrate 10 are painted as shown by wavy lines 24.

Figure 3A:
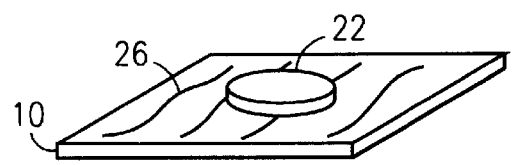
FIGS. 3A, 3B and 3C diagrammatically illustrate the steps utilized to create a dry film decorative panel covered with metal or plastic sheet foil.
Figure 3B:
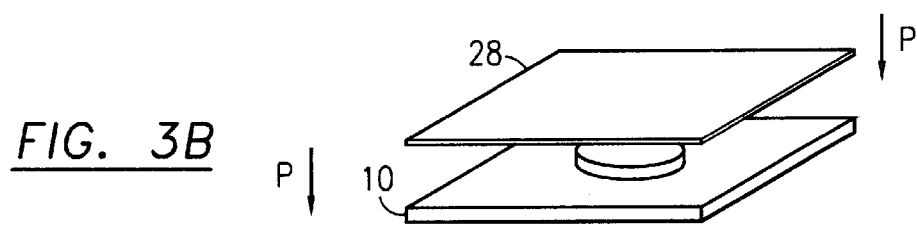
Figure 3C:
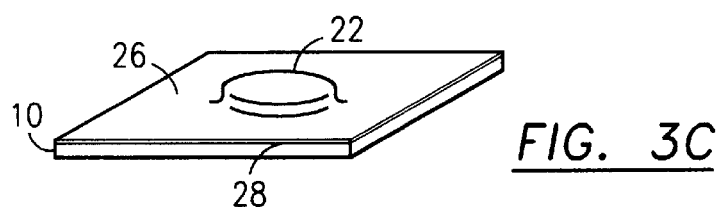

FIGS. 3A–3C diagrammatically show a dry film decorative panel covered by metal foil or plastic sheet configured to appear like a metal foil. In FIG. 3A, relief bearing substrate 10, 22 is covered with an adhesive 26. In FIG. 3B, metal film or plastic sheet having the appearance of metal foil 28 is placed atop relief supporting substrate 10, 22 under a certain predetermined pressure P. The film can be placed under pressure on substrate 10 via a vacuum table or a press. FIG. 3C shows relief carrying substrate 10 having film layer 28 covering surface 11 as well as relief 22.

Figure 4:
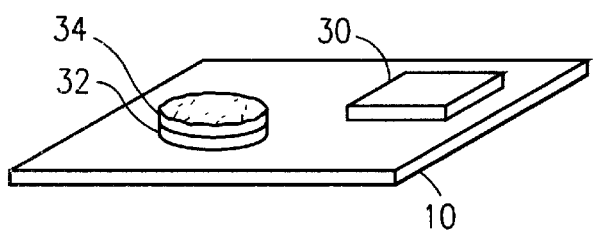
FIG. 4 diagrammatically illustrates a multiple level or multiple layer dry film decorative panel.

FIG. 4 diagrammatically shows substrate 10 having one relief 30 and a second, multi-layer relief 32, 34. The dry film reliefs can be manufactured in multiple layers or heights. The designer manufacturer repeats the application of photoresist in step 1B, the placement of art work stencil 14 in FIG. 1C, the exposure to UV light in step 1D, the developer wash in step 1E and creates multiple layers of photoresist on the substrate carrying the first or primary layer dry film design.

Figure 5A:
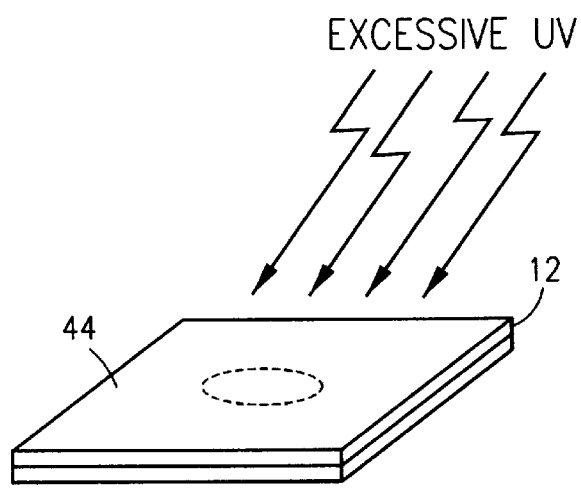
FIGS. 5A and 5B diagrammatically illustrate wrinkling the dry film decorative panel prior to painting or applying the foil.

Additionally, the outer or top layer 34 in the multiple layer relief in FIG. 4 is roughened or wrinkled due to over exposure of UV light. The "wrinkled" look of the outer dry film relief is created by over-exposure of the artwork exposed dry film by UV light during step 1D. (FIG. 1D). The wrinkled or roughened look is created by the rippling of the film due to over exposure of the UV light. FIG. 5A shows one method of wrinkling the dry film surface.

When painted, the decorative panel looks like an embossed panel. The decorative panel can have multiple layers of photoresist. Reliefs of 0.002 inches to 0.008 inches have been achieved by this process.

Figure 5B:
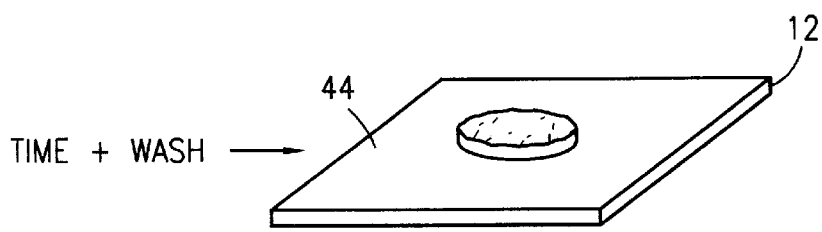

FIG. 5B shows that after over-exposure of UV and developer wash, the relief 23 shows a wrinkled surface 25. This textured surface can be painted (FIG. 2) or covered by metal foil or plastic foil (FIG. 3C). The texture comes through the paint and metal foil.

Figure 6A:
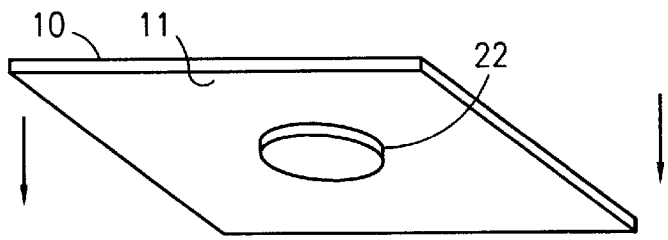
FIGS. 6A–6E diagrammatically illustrate the creation of a press plate utilizing a dry film decorative panel.
Figure 6B:
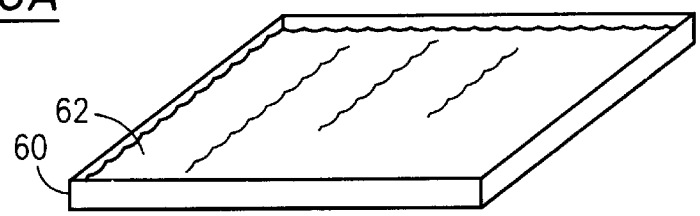
Figure 6B:
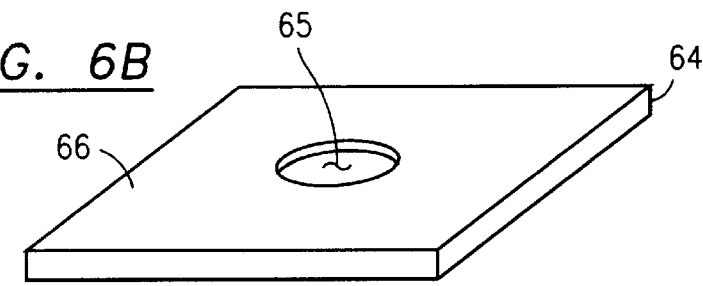

FIGS. 6A–6E diagrammatically illustrate the manufacture of a press plate utilized to reproduce decorative panels from resinous or castable or mold material. FIG. 6A shows substrate 10 carrying a relief 22. From the relief carrying substrate, a mold is made using suitable molding coumpounds, such as resin, plastic, silicone rubber, plaster, etc. The substrate and relief are cast in a vat 60 having a mold compound material 62. The mold compound is utilized to create an internegative which is a mirror three-dimensional image of the decorative design in relief 22. This internegative 64 is shown in FIG. 6B. In other words, if relief 22 protrudes beyond surface 11 of substrate 10, internegative 64 has a cavity 65 beneath surface 66.

Figure 6C:
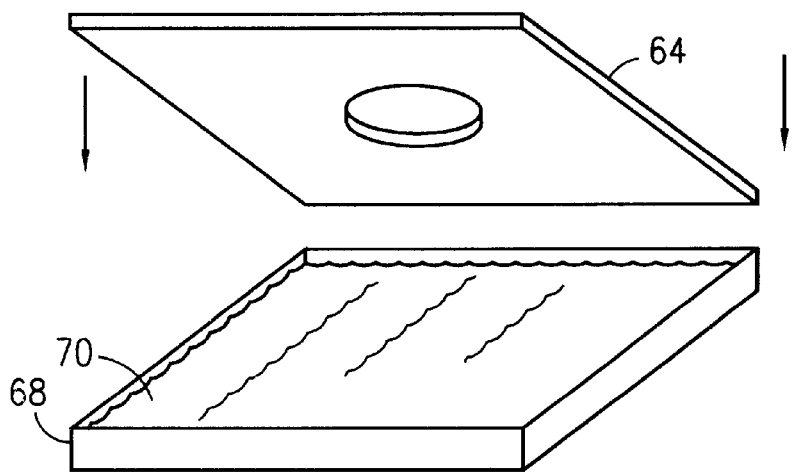
Figure 6D:
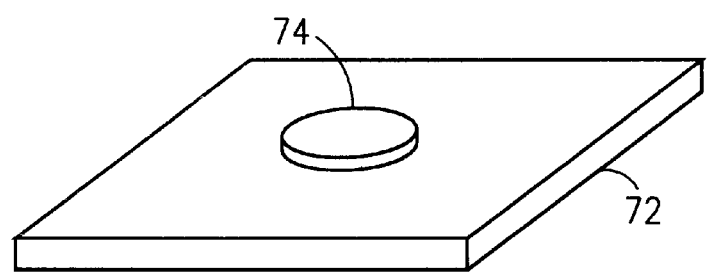

FIG. 6C shows internegative mold 64 which is utilized to cast a hard press plate using resinous material or epoxies or other castable compounds which will substantially harden after unmolding. Internegative 64 is placed in vat 68 carrying resinous material or castable compound 70. This procedure creates a hard press plate 72 (FIG. 6D). Press plate 72 has a relief structure 74 which is substantially similar to (preferably identical to) the decorative design of relief 22 shown in FIG. 6A. Such press plates are suitable for short production runs where the traditional stainless steel press plates are far too expensive to manufacture for the short production run.

Figure 6E:
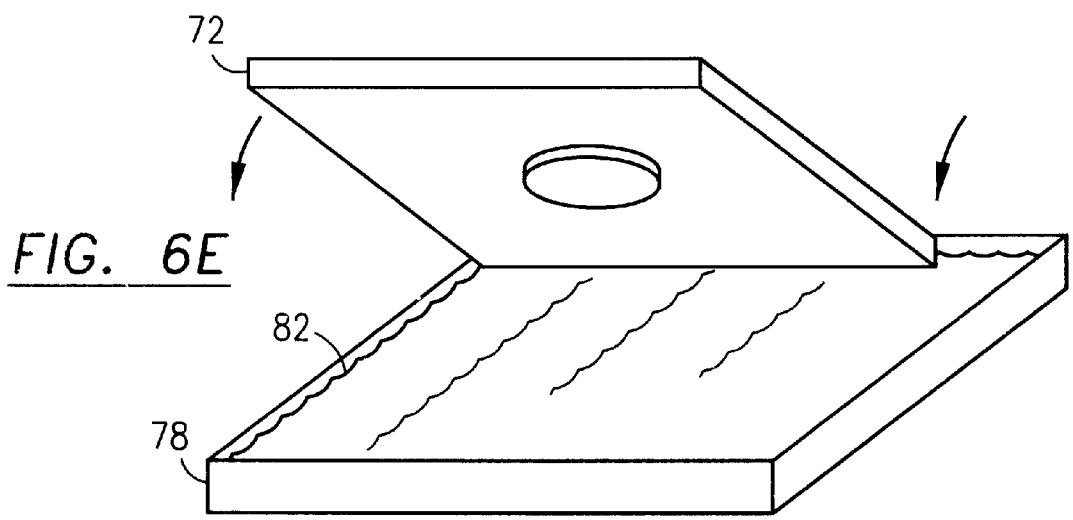

In FIG. 6E, press plate 72 is, in the illustrated embodiment, pressed into liquid resin or other compounds or materials which can be molded through pressure thereby enabling reproduction of multiple castable panels carrying the design in relief.

Press plate 72 is used to create multiple phenolic resin sheets in relief for HPL (high pressure laminates) using melanine, using metal foil or using other films having the appearance of metal.

Figure 7:
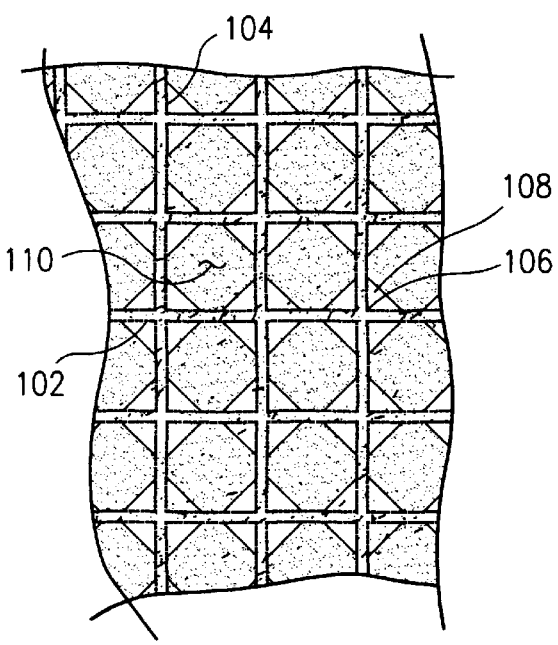
FIGS. 7 and 8 provide examples of decorative panel designs.
Figure 8:
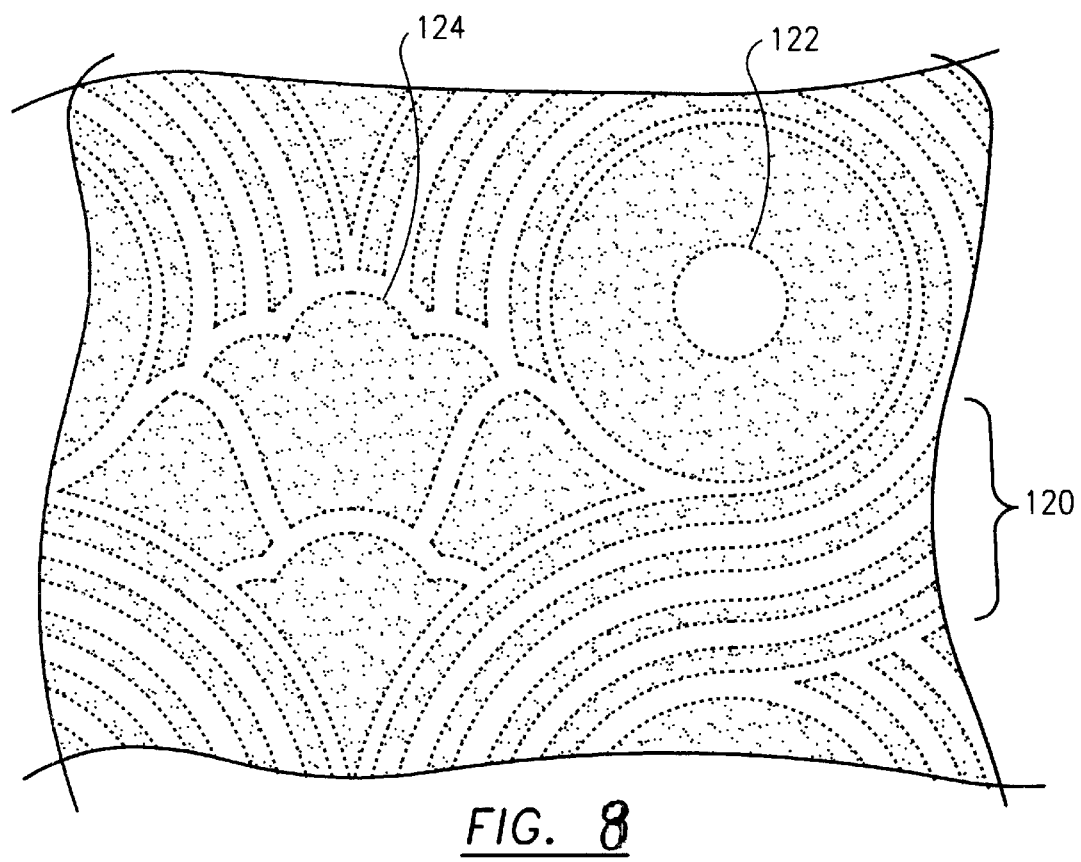

FIGS. 7 and 8 show various decorative panel designs. FIG. 7 shows lateral and longitudinal lines 102, 104 which have been wrinkled or textured in accordance with the principles of the present invention. About each intersection of a lateral and a longitudinal line (for example, intersection 106), the dry film decorative panel forms a diamond shape smooth region 108. In the major spatial region of the grid in area 110, the surface is textured. In this multiple layer configuration, covered with metal foil, several integrated line designs and surface features have been created using the dry film photoresist method disclosed herein. FIG. 8 shows a portion of a swirl design 120 about concentric design element 122 and floral leaf patterns 124. Other decorative designs can be created based on any type of line art work.

The claims appended hereto are meant to cover modifications and changes within the scope and spirit of the present invention.

What is claimed is:

1. Method of making a dry film decorative panel covered with paint comprising the steps of:

providing a substrate, at least one sheet of dry photoresist film, developer wash and at least one artwork stencil;

placing said dry film intermediate said artwork and said substrate and forming a layered composite;

exposing the layered composite to ultraviolet (UV) light and thereby curing the exposed portions of the layered composite;

removing the artwork from the layered composite;

washing away non-UV exposed dry film layer portions from cured dry film portions with developer from said composite and creating reliefs on said substrate with said UV exposed dry film; and, painting the relief and supporting substrate to form a decorative panel;

wherein said layered composite is over exposed to UV light thereby causing said dry film to become textured.

2. A method as claimed 1 including the step of texturing the dry film layer prior to the step of painting.

3. Method of making a dry film decorative panel covered with paint comprising the steps of:

providing a substrate, at least one sheet of dry photoresist film, developer wash and at least one artwork stencil;

placing said dry film intermediate said artwork and said substrate and forming a layered composite;

exposing the layered composite to ultraviolet (UV) light and thereby curing the exposed portions of the layered composite;

removing the artwork from the layered composite;

washing away non-UV exposed dry film layer portions from cured dry film portions with developer from said composite and creating reliefs on said substrate with said UV exposed dry film; and, painting the relief and supporting substrate to form a decorative panel;

wherein multiple layers of relief are formed by repeating the steps of placing dry film intermediate artwork and cured dry film portions, exposing the resulting layered composite to UV light, removing artwork and washing with developer.

4. A method as claimed in claim 3 wherein said layered composite is over exposed by UV light thereby causing said dry film to become textured.

5. A method as claimed in claim 3 wherein the step of texturing the dry film layer occurs prior to the step of painting.

6. Method of making a dry film decorative panel covered with paint comprising the steps of:

providing a substrate, at least one sheet of dry photoresist film, developer wash and at least one artwork stencil;

placing said dry film intermediate said artwork and said substrate and forming a layered composite;

exposing the layered composite to ultraviolet (UV) light and thereby curing the exposed portions of the layered composite;

removing the artwork from the layered composite;

washing away non-UV exposed dry film layer portions from cured dry film portions with developer from said composite and creating reliefs on said substrate with said UV exposed dry film; and, painting the relief and supporting substrate to form a decorative panel;

repeating the placement of dry film intermediately, exposing a layered composite to UV light, removing artwork and washing away non-UV exposed dry film all on the initially prepared relief carrying substrate.

7. A method as claimed in claim 6 wherein the step of painting occurs subsequent to all other steps.

8. Method of making a dry film decorative panel covered with metal or plastic sheet foil comprising the steps of.

providing a substrate, at least one sheet of dry photoresist film, developer wash and at least one artwork stencil;

placing said dry film intermediate said artwork and said substrate and forming a layered composite;

exposing the layered composite to ultraviolet (UV) light and thereby curing the exposed portions of the layered composite;

removing the artwork from the layered composite;

washing away non-UV exposed dry film layer portions from UV exposed dry film portions with developer from said composite and creating reliefs on said substrate with said UV exposed dry film; and, adhering said foil to the relief and supporting substrate to form a decorative panel.

9. A method as claimed in claim 8 wherein said layered composite is over exposed to UV light thereby causing said dry film to become textured.

10. A method as claimed 9 including the step of texturing the dry film layer prior to the step of adhering foil.

11. A method as claimed in claim 8 wherein multiple layers of relief are formed by repeating the steps of placing dry film intermediate artwork and cured dry film portions, exposing the resulting layered composite to UV light, removing artwork and washing with developer.

12. A method as claimed in claim 11 wherein said layered composite is over exposed by UV light thereby causing said dry film to become textured.

13. A method as claimed in claim 12 wherein the step of texturing the dry film layer occurs prior to the step of adhering foil.

14. A method as claimed in claim 9 including the steps of repeating the placement of dry film intermediately, exposing a layered composite to UV light, removing artwork and washing away non-UV exposed dry film all on the initially prepared relief carrying substrate.

15. A method as claimed in claim 14 wherein the step of adhering foil occurs subsequent to all other steps.

16. Method of making decorative panels from castable compound material with a press plate created from a dry film decorative panel having substantially the same decorative design as said reproduced decorative panels comprising the steps of:

providing a substrate, at least one sheet of dry photoresist film, developer wash and at least one artwork stencil depicting at least a portion of said decorative design;

placing said dry film intermediate said artwork and said substrate and forming a layered composite;

exposing the layered composite to ultraviolet (UV) light and thereby curing the exposing portions of the layered composite;

removing the artwork from the layered composite;

washing away non-UV exposed dry film layer portions from UV exposed dry film portions with developer from said composite and creating reliefs on said substrate with said UV exposed dry film and thereby creating said dry film decorative panel; and, creating an internegative with said dry film decorative panel;

creating a positive press plate with said internegative bearing substantially the same decorative design as said dry film decorative panel; and repetitively casting said press plate, bearing substantially the same decorative design as said dry film decorative panel, into said castable material and creating multiple decorative panels having substantially the same decorative design as said dry film decorative panel.

17. A method as claimed in claim 16 wherein said layered composite is over exposed to UV light thereby causing said dry film to become textured.

18. A method as claimed in claim 16 wherein multiple layers of relief are formed by repeating the steps of placing dry film intermediate artwork and cured dry film portions, exposing the resulting layered composite to UV light, removing artwork and washing with developer.

19. A method as claimed in claim 18 wherein said layered composite is over exposed by UV light thereby causing said dry film to become textured.

* * * * *